United States Patent [19]

Holzinger et al.

[11] Patent Number: 4,948,645
[45] Date of Patent: Aug. 14, 1990

[54] TAPE AUTOMATED BONDING AND METHOD OF MAKING THE SAME

[75] Inventors: Steven T. Holzinger, Tempe; Larry W. Barker, Chandler, both of Ariz.

[73] Assignee: Rogers Corporation, Rogers, Conn.

[21] Appl. No.: 388,243

[22] Filed: Aug. 1, 1989

[51] Int. Cl.⁵ .............................................. B32B 3/10
[52] U.S. Cl. ...................................... 428/40; 428/138;
 428/913; 428/137; 357/70; 156/252; 156/344
[58] Field of Search ................. 428/137, 138, 40, 913;
 357/70; 156/252, 344

[56] References Cited

U.S. PATENT DOCUMENTS 3,858,721 1/1975 Boyer et al. ...................... 206/460
4,571,354 2/1986 Maxwell ............................ 428/78

Primary Examiner—Alexander S. Thomas
Attorney, Agent, or Firm—Fishman, Dionne & Cantor

[57] ABSTRACT

A method for making a tape for tape automated bonding and the tape made therefrom is presented. In accordance with the present invention, a bonding material is used to both (1) hold the annular support ring in place within the feature window with sufficient tenacity to stabilize the TAB leads; and (2) allow removal of the annular support ring from the TAB leads once the leads have been inner and outer lead bonded (e.g. just before the TAB and microcircuit are encapsulated into a final product). One such bonding material comprises a substance which ordinarily acts as an adhesive, but which has its adhesive bond weakened or destroyed by application of heat, cold, ultraviolet light, infrared light or the like. Still another bonding material is a pressure-sensitive strong enough to hold the support ring in place during all operations up to and including inner and outer lead bonding; but weak enough to allow it to be peeled away thereafter, without harming the leads or the inner/outer lead bonds.

21 Claims, 7 Drawing Sheets

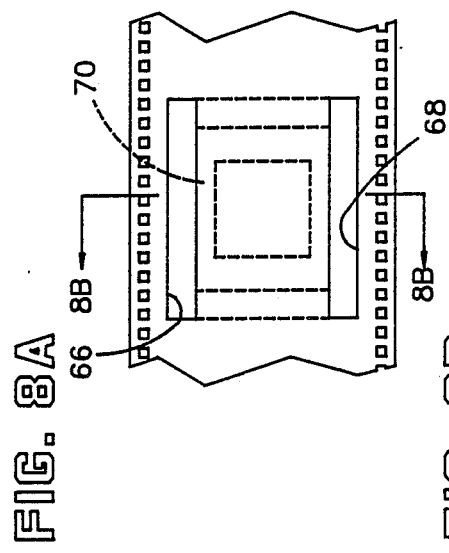
FIG. 7A
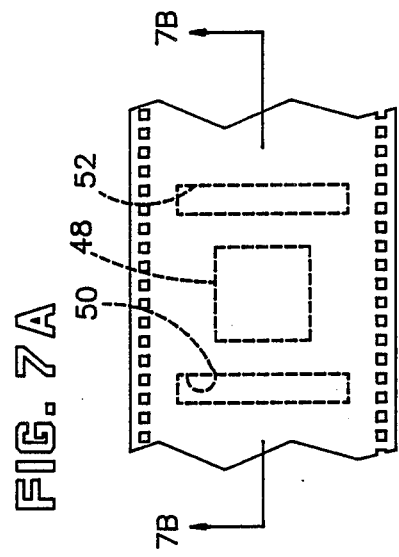
FIG. 8A
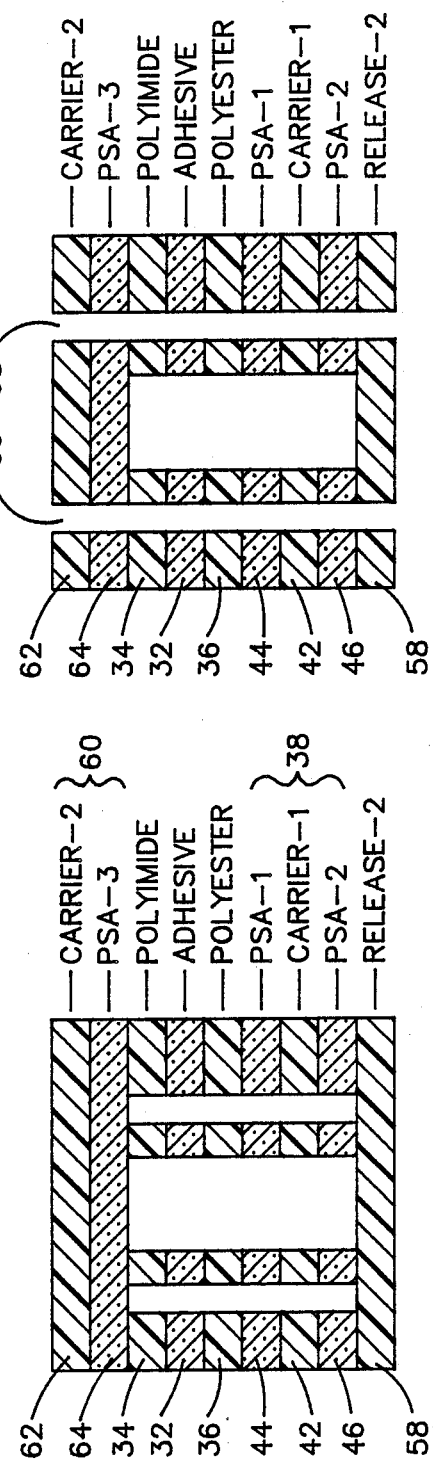
FIG. 7B
FIG. 8B

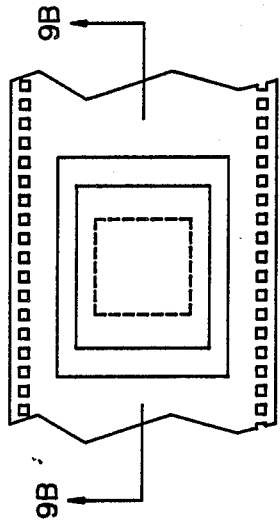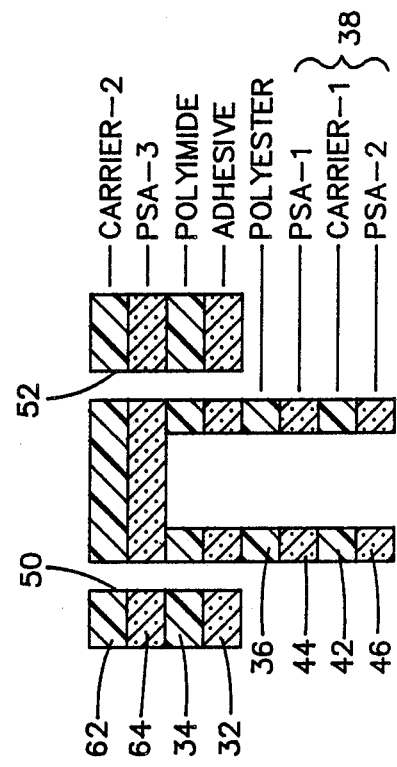

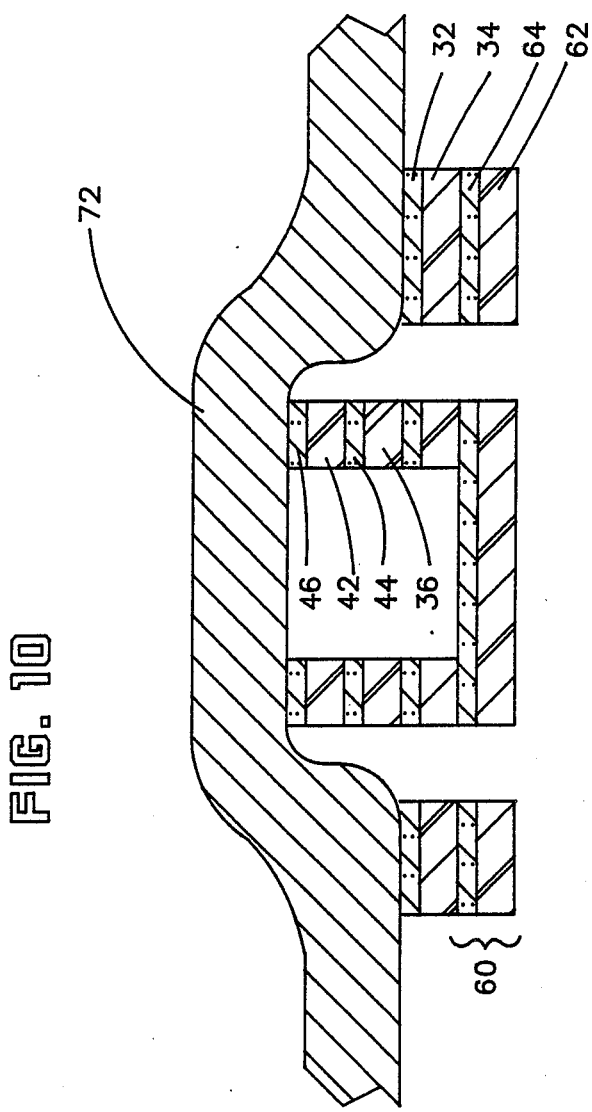

TAPE AUTOMATED BONDING AND METHOD OF MAKING THE SAME

BACKGROUND OF THE INVENTION

This invention relates to a method for making tape for tape automated bonding (TAB) for integrated circuits (ICs) and the tape product derived therefrom. More particularly, this invention relates to a novel method for producing three layer TAB materials comprising conductive foil, adhesive and polymer (polyimide) film wherein the feature window includes a removable support ring.

The general process of tape automated bonding for integrated circuits is known in the art. The TAB process requires production and use of a substrate having a feature window into which the integrated circuit is placed for connection to circuitry.

There are currently three types of tape automated bonding (TAB) materials including "one layer" (all metal), "two layer" (polyimide-metal), and "three layer" (polyimide: adhesive: metal).

Interest in TAB technology is on the rise among electronic manufacturers as an integrated circuit (IC) interconnection method because it offers several advantages over other technologies. One of these advantages is its ability to bond to very small closely spaced pads on the device using thermo-compression bonding techniques. When the TAB leads are long and narrow, however, it becomes increasingly difficult to ensure that they remain exactly as designed: planar and precisely located, so that they will align exactly with bond sites.

Because both two and three layer materials have nonconductive backing, both offer the potential for a method of support for long delicate TAB leads. In the case of two-layer material, where patterns are etched into both copper and polyimide layers, a support structure of virtually any shape, including free floating, is possible.

Three-layer material has had a more limited range of support structure available. Because features in the polyimide layer are formed in a mechanical punching operation prior to the addition of the copper layer, it had previously been impossible to offer a free floating annular support ring. Previously, rings had to be supported, typically by using corner tie bars.

Following material processing, immediately prior to outer lead bonding, chip and leads must be excised from the continuous tape. With prior art technology, tie bars have to be excised at the same time as outer leads. This requires tooling to pierce polyimide as well as copper, and a tool configuration more complex than the simple square design used with floating rings. In addition, tie bars require areas of the TAB design to be free of conductors, thus limiting the design freedom of the packaging engineer.

The problems and drawbacks of the support rings necessitating corner ties has been solved by a free floating annulus support ring disclosed in U.S. Pat. No. 4,571,354, assigned to the assignee hereof and incorporated herein by reference. The method of U.S. Pat. No. 4,571,354 uses a temporary carrier or support substrate to form the free-floating annular ring. The ring is held permanently in place when the copper layer is laminated to the polyimide, at which time the temporary carrier is removed. The support ring not only provides physical support for the delicate TAB interconnection leads, but it also aligns and registers them by fixing their position and maintaining the separation spaces between them.

Three-layer TAB materials offers significant advantages over two-layer materials. Heavier polyimide film, typically 5 mil thickness (1 mil=0.001 inch) aids in dimensional stability. The adhesive bond achieved between copper and polyimide layers is generally better than an adhesiveless bond. No secondary etch of the polyimide layer is required. The thermosetting phenolic butyral adhesive layer offers a high quality second dielectric layer, one which absorbs far less water (less than 0.1 percent) than the polyimide (three percent), and hence is a good barrier to leakage currents.

However, one important drawback of the three-layer TAB material of U.S. Pat. No. 4,571,354 (and indeed those three-layer TAB materials utilizing support rings of any type including corner ties) is that the support ring (e.g., polyimide) and the adhesive (acrylic, epoxy or phenolic butyral) are made of organic material. Furthermore, the support ring and adhesive can retain small quantities of water, and under some circumstances, there can be caused an outgassing of material from the organic materials.

In certain demanding applications, particularly in the military, it is desirable to avoid having an organic material contained within the IC package. Unfortunately, a dilemma exists in that these demanding applications also require the support ring for accurate inner lead and outer lead bonding.

SUMMARY OF THE INVENTION

The above-discussed and other problems and deficiencies of the prior art are overcome or alleviated by the method of the present invention for making a tape for tape automated bonding and the tape made therefrom. In accordance with the present invention, a bonding material is used to both (1) hold the annular support ring in place within the feature window with sufficient tenacity to stabilize the TAB leads; and (2) allow removal of the annular support ring from the TAB leads once the leads have been inner and outer lead bonded (e.g. just before the TAB and microcircuit are encapsulated into a final product).

Once such bonding material comprises a substance which ordinarily acts as an adhesive, but which has its adhesive bond weakened or destroyed by application of heat, cold, ultraviolet light, infrared light or the like. Still another bonding material is a pressure-sensitive adhesive strong enough to hold the support ring in place during all operations up to and including inner and outer lead bonding; but weak enough to allow it to be peeled away thereafter, without harming the leads or the inner/outer lead bonds.

A significant feature of the present invention is that it may be employed either with free floating annulus support rings of the type disclosed in U.S. Pat. No. 4,571,354; or more conventional support rings having corner ties.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures:

FIGS. 3A-9A and 3B-9B are respective plan and cross-sectional elevation views depicting a method in accordance with the present invention of providing a floating annular support ring on three-layer TAB material;

FIG. 10 is a cross-sectional view of a strip of copper laminated to the TAB material of FIG. 9.

DESCRIPTION OF THE PREFERRED EMBODIMENT

Figure 1:
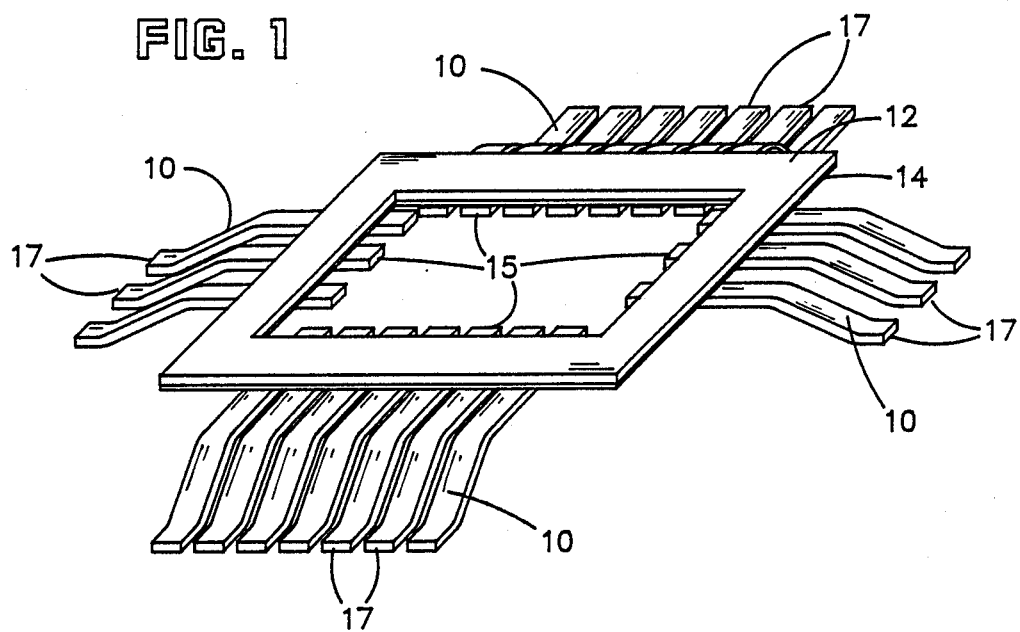
FIG. 1 is a front perspective view of tape automated bonding leads bonded together by a support ring.

Referring first to FIG. 1, tape automated bonded leads 10 are shown bonded together by a support ring 12 in a known fashion. It will be appreciated that leads 10 will have been formed in a known manner from tape automated bonding material such as that disclosed in U.S. Pat. No. 4,571,354 with the leads being thereafter excised from the TAB material as shown in FIG. 1. At this point, support ring 12 provides physical support for the interconnection leads 10 and acts to align and register the interconnection leads by fixing the position of the leads and maintaining the separation space between the leads.

Support ring 12 is comprised of a polymeric material, generally polyimide (such as KAPTON) and is attached to leads 10 via an organic adhesive 14. Generally, organic adhesive 14 comprises a thermosetting phenolic butyral adhesive layer. It will be appreciated that the ends 15 of leads 10 which terminate within ring 12 define the inner lead bonding points while the opposed ends 17 of leads 10 define the outer lead bonding points.

Figure 2:
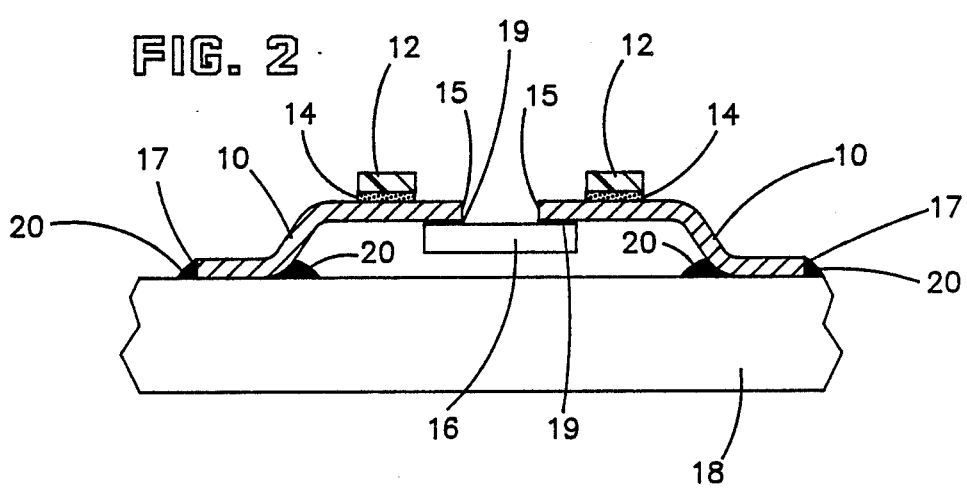
FIG. 2 is a side elevation view of an electronic device mounted onto tape automated bonding leads.

Turning now to FIG. 2, the construction of FIG. 1 is shown after the inner lead bonding points have been bonded to a circuit device 16 and the outer lead bonding points have been bonded to a circuit board, hybrid circuit or similar package identified generally at 18. It will be appreciated that electronic device 16 typically comprises a silicon or other integrated circuit chip. Inner lead bonding is accomplished by solder or other suitable conductive adhesive 19. Similarly, outer lead bonding is also established by solder 20 or its equivalent. Thereafter, circuit device 16, ring 12 and leads 10 are encapsulated into a final package.

As discussed in detail hereinabove, one important drawback to the construction shown in FIG. 2 is the deleterious effect of the organic material in support ring 12 and adhesive 14. This is particularly troublesome in certain demanding applications where it is highly desirable to avoid having any organic material contained within the IC package. However, as was also mentioned hereinabove, such demanding applications also require the use of a support ring 12 to maintain leads 10 in a precise and fixed position in space to ensure proper connection both to IC chip 16 and electronic package 18.

In accordance with an important feature of the present invention, adhesive 14 of FIG. 2 is replaced with a bonding material which will both hold support ring 12 in place with sufficient tenacity so as to stabilize leads 10 and allow removal of the support ring once leads 10 have been inner and outer lead bonded (just before the TAB and microcircuit are encapsulated into a final package).

In accordance with a first embodiment of this invention, one such bonding material is a substance which ordinarily acts as an adhesive, but which has its adhesive bond weakened or destroyed by application of heat, cold, ultraviolet light, infrared light or the like. Examples of such an adhesive material include, but are not limited to crystalline polyurethanes available from B. F. Goodrich under the mark Estanes or unsaturated polyesters. In a second embodiment, a bonding material suitable for use in the present invention comprises a pressure sensitive adhesive which is strong enough to hold the support ring in place during all operations up to and including inner and outer lead bonding, but weak enough to allow it to be peeled away thereafter without harming the leads or the inner/outer lead bonds. Examples of such an adhesive material include, but are not limited to cross-linked acrylics.

Figure 3A:
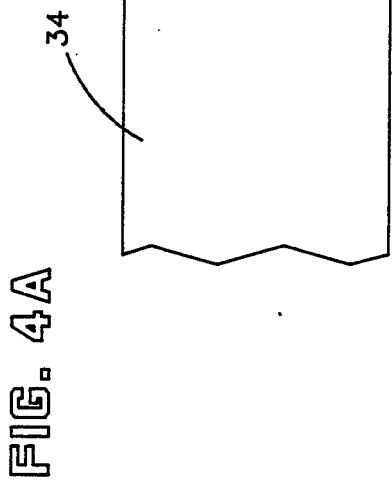
Figure 3B:
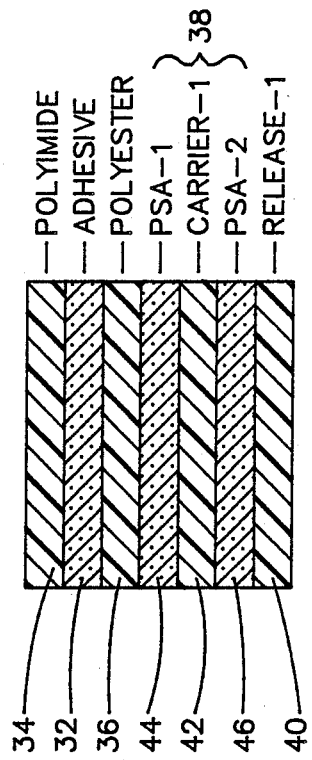

An example of the present invention utilizing a pressure sensitive adhesive is set forth hereinbelow in conjunction with FIGS. 3-9. Referring first to FIGS. 3A and 3B, a preferred embodiment of a method of making TAB material in accordance with the present invention begins with the manufacture of a standard flexible cover film identified at 30. Cover film 30 is comprised of a known thermoset adhesive (sold under the trademark R/flex 8970 by Rogers Corporation) which is sandwiched between a thin strip of polyimide (KAPTON) and polyester (MYLAR).

Figure 4A:
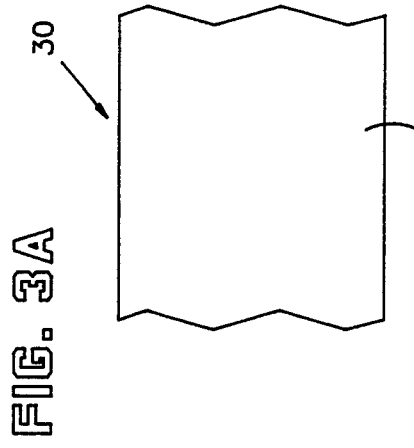
Figure 4B:
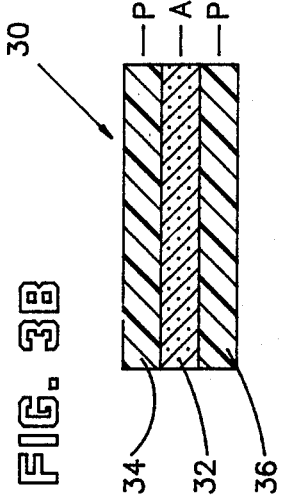

Referring now to FIGS. 4a and 4b, in the next step, a double sided tape 38 having a release layer 40 is bonded to polyester layer 36. Double sided tape 38 comprises a flexible carrier film 42 having opposed layers 44 and 46 of a suitable pressure sensitive adhesive. Release layer 40 is releasably bonded to pressure sensitive adhesive 46.

Figure 5A:
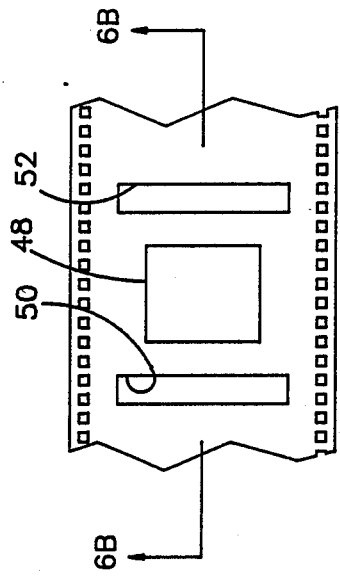
Figure 5B:
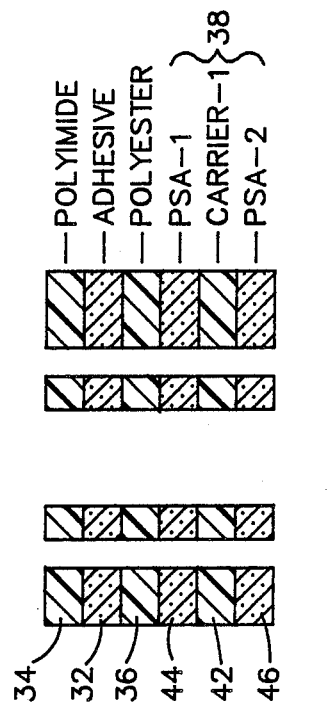

In the next step shown in FIGS. 5a and 5b, a first punching step is conducted through all layers of flexible film and adhesive so as to form a central feature window 48 and a pair of opposed rectangular openings 50 and 52 which are substantially perpendicular to the longitudinal length of the TAB material. In addition, a plurality of sprocket holes 54 and 56 are also punched in a known manner.

Figure 6A:
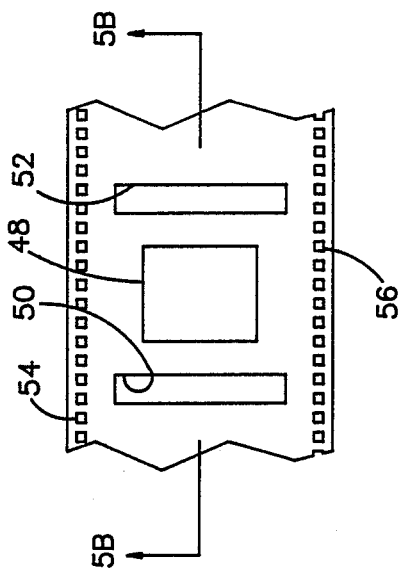
Figure 6B:
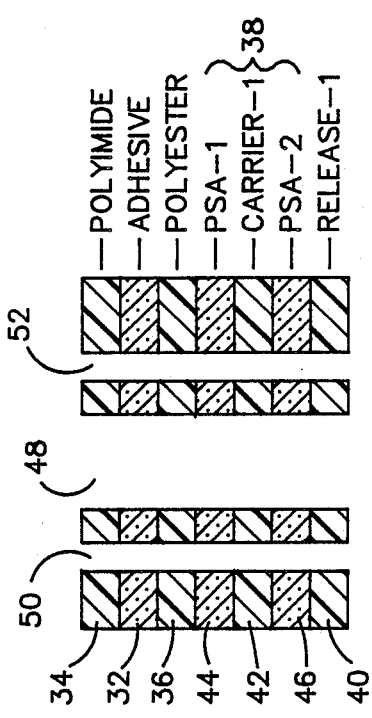

Referring now to FIGS. 6a and 6b, in the next step, release layer 40 is removed to expose pressure sensitive adhesive layer 46.

In the next step of FIGS. 7a and 7b, a second release layer 58 is applied to pressure sensitive adhesive layer 46. In addition, an adhesive tape 60 comprised of a flexible carrier film 62 having a layer of pressure sensitive adhesive 64 thereon is applied to polyimide layer 34.

In the next step, a second punching operation is conducted to define a pair of rectangular openings 66 and 68 which communicate with openings 50 and 52. This second punching step will also form a floating ring identified at 70 in FIG. 8a.

In the next step (FIGS. 9a and 9b), the polyester layer 36 and double sided adhesive tape 38 is removed everywhere except for ring 70 leaving the thermoset adhesive 32 exposed on all those areas except for ring 70. In addition, release layer 58 is also removed. It will be appreciated that release layer 58 is removed only from the ring 70 after the polyester layer 36 and double sided tape 38 has been removed from the rest of the TAB material.

In the next step shown in FIG. 10, a strip of copper 72 or other suitable conductive lead forming material is laminated to the side of the TAB material having the exposed thermoset adhesive 32 and pressure sensitive adhesive 46. After curing, adhesive layer 32 forms a strong permanent thermoset bond with the copper 72, while pressure sensitive 46 forms only a temporary bond and is easily removable. Thus, the pressure sensitive adhesive will be on the floating annulus ring 70 only while all other surfaces between the TAB material and copper 72 or other conductive material will be permanently bonded together by the thermoset or like permanent adhesive. The TAB leads are then formed using standard etching methods and the leads are inner and outer bonded as described hereinabove. Thereafter, floating annulus ring 70 may be easily removed from the adhesive 46/copper interface leaving behind only individual leads such as those depicted in FIG. 1.

As mentioned, rather than pressure sensitive adhesive layer 46, adhesive layer 46 may also consist of a suitable adhesive which has its bond weakened or destroyed by application of heat, cold, ultra violet light, infrared light or the like. Thus, subsequent to copper lamination, formation of TAB leads and inner and outer lead bonding, this alternative adhesive (which would be in the same location as pressure sensitive adhesive 46) would then be removed by application of a suitable external environmental change such as one of those listed above.

Still another alternative method of the present invention is to use a transfer adhesive (e.g. one layer of pressure sensitive or the like adhesive only without any carrier film) in the step corresponding the FIGS. 4a and 4b rather than the double sided adhesive tape 38. In this alternative method, the overall thickness of the floating annulus ring would be reduced and thereby make the thickness thereof more commensurate with the thickness of the rest of the TAB material.

Figure 12:
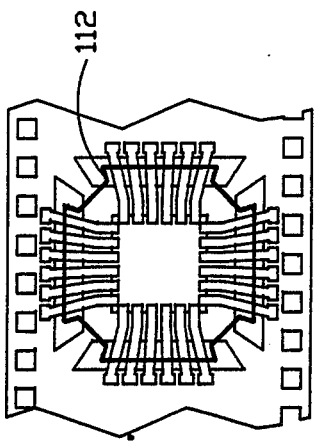
FIGS. 11-13 are plan views of the present invention employed with a support ring having corner ties.
Figure 11:
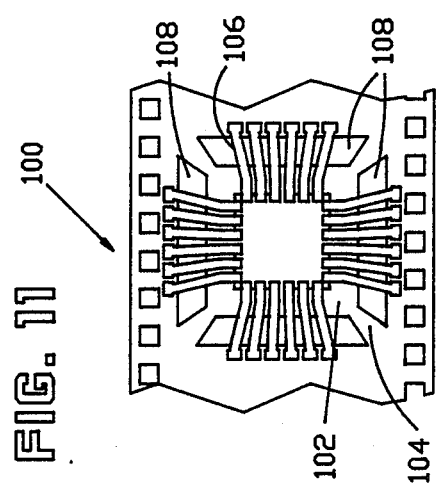
Figure 13:
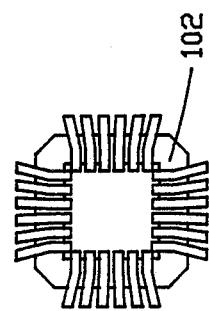

Also, while the present invention is particularly well suited for use with floating annular TAB materials of the type disclosed in U.S. Pat. No. 4,571,354, this invention may also be used in TAB materials employing non-floating support rings. An example of this is shown in FIGS. 11–13 where a portion of TAB material is identified generally at 100. TAB material 100 includes a support ring 102 which is connected at the four corners thereof by corner supports 104 and has been manufactured in the same manner as was described in foregoing FIGS. 3–10. A copper layer (not shown) on TAB material 100 has been etched in a standard manner to form a plurality of individualized leads 106 having outer lead bond areas 108 and terminating at an inner lead area 110.

Next, as shown in FIG. 12, a path 112 is cut by an excision tool whereupon the leads 106 are severed within the outer lead bond areas 108 and the corner ties 104 are severed at the respective intersection with support ring 102. The excised TAB site is shown in FIG. 13 without a chip shown in the inner lead bond area 110. It will be appreciated that normally, a chip would have been bonded to the TAB site before excision. However, for the sake of clarity, no chip has been shown. Subsequent to the bonding of leads 106 in the outer lead bond area, support ring 102 is peeled (if a pressure sensitive tape is used) or the bond is destroyed by application of an external evironmental change such as heat, ultraviolet light, infrared light etc.

As is clear from the foregoing, in accordance with the several embodiments of the present invention, a method is provided for manufacturing tape for tape automated bonding for integrated circuits and the like wherein the tape includes a floating annulus TAB for improved precision of inner and outer lead bonding and wherein the floating annular TAB is removable prior to encapsulation of the final electronic package. As a result, the drawbacks and deficiencies of including organic material within the final electronic package is overcome as the floating annulus TAB and its associated adhesive will no longer be within the encapsulated package. Also, by removing the floating annular TAB from the final encapsulated package, other known drawbacks associated with the water absorption are also overcome.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. Tape automated bonding (TAB) material comprising:
   a first strip of a flexible non-conductive material, said first strip having at least one feature window therein;
   a second strip of a flexible conductive material on said first strip;
   a layer of first adhesive between said first and second strips, and permanently bonding said first strip to said second strip;
   a support ring in said feature window, said support ring having opposed first and second surfaces, said first surface of said support ring being permanently bonded by said first adhesive to said first strip;
   a layer of second adhesive on said second surface of said support ring, said second adhesive releasably bonding said support ring to said second strip whereby said support ring is removable from said second strip.

2. The TAB material of claim 1 wherein:
   said second adhesive is a pressure sensitive adhesive and said support ring is peelable from said second strip.

3. The TAB material of claim 2 wherein:
   said second adhesive comprises cross-linked acrylic.

4. The TAB material of claim 1 wherein:
   said second adhesive is an adhesive having a bond which is weakened or destroyed by application of an external environmental change.

5. The TAB material of claim 4 wherein:
   said environmental change is at least one change selected from the group consisting of heat, cold, ultraviolet light or infrared light.

6. The TAB material of claim 4 wherein:
   said second adhesive is selected from the group consisting of crystalline polyurethanes or unsaturated polyesters.

7. The TAB material of claim 1 wherein:
   said support ring comprises first and second supports and a layer of third adhesive sandwiched between said first and second supports.

8. The TAB material of claim 7 wherein:
   said third adhesive is a pressure sensitive adhesive.

9. The TAB material of claim 1 including:
   a third strip of flexible non-conductive material being releasably bonded to a surface of said first strip which is opposed to said second strip.

10. The TAB material of claim 1 wherein:
    said support ring includes corners, at least one of said corners being attached to said first strip.

11. The TAB material of claim 1 wherein:
said support ring is unattached to said first strip.

12. The TAB material of claim 1 including:
a plurality of discrete leads formed from said second strip, said leads terminating in said feature window and being releasably bonded to said support ring by said second adhesive.

13. A method of making tape automated bonding material comprising:
forming a laminate comprised of a first strip of a flexible non-conductive material bonded by a first curable adhesive to a second strip of a flexible non-conductive material;
forming a feature window through said laminate;
forming a support ring through said laminate in said feature window;
applying a layer of a second adhesive on said support ring;
removing said second strip from said laminate in all areas except for said support ring to expose said first adhesive on said first strip;
adhering a third strip of conductive material onto said exposed first adhesive and said second adhesive to bond said third strip to said first strip and to said support ring, the adhesive bond between said third strip and said support ring being releasable whereby said support ring is removable from said second strip;
curing said first adhesive to form a permanent bond between said first and third strips.

14. The method of claim 13 including:
forming a plurality of discrete leads in said third strip, said leads terminating in said feature window and being releasably bonded to said support ring by said second adhesive.

15. The method of claim 14 including:
removing said support ring from said terminals.

16. The method of claim 15 wherein said removing step comprises:
peeling said support ring from said second strip.

17. The method of claim 15 wherein said removing step comprises:
applying an external environmental change to said second adhesive to thereby weaken or destroy the adhesive bond between said support ring and said second strip.

18. The method of claim 17 wherein:
said environmental change comprises at least one of the changes selected from the group consisting of heat, cold, ultraviolet light or infrared light.

19. The method of claim 13 wherein:
said support ring comprises first and second supports and a layer of third adhesive sandwiched between said first and second supports.

20. The method of claim 13 including:
said third adhesive is a pressure sensitive adhesive.

21. The method of claim 13 including:
releasably bonding a fourth strip of flexible non-conductive material to a surface of said first strip which is opposed to said second strip.

* * * * *